Feb. 9, 1960 R. R. BLAIR 2,924,725

PULSE STEERING CIRCUIT

Filed Dec. 16, 1957

INVENTOR
R. R. BLAIR
BY Walter M. Hill
ATTORNEY

United States Patent Office 2,924,725
Patented Feb. 9, 1960

2,924,725

PULSE STEERING CIRCUIT

Royer R. Blair, Berkeley Heights, N.J., assignor to Bell Telephone Laboratories, Incorporated, New York, N.Y., a corporation of New York Application December 16, 1957, Serial No. 703,217

15 Claims. (Cl. 307—88.5)

This invention pertains to binary counters, and particularly to a binary counter capable of operating in response to trigger pulses occurring at very high repetition frequencies.

A binary counter is an electronic circuit generally comprising a pair of amplifiers which have their input and output terminals cross-coupled to form a regenerative feedback loop which renders one of the amplifiers conducting and the other nonconducting. Successive trigger pulses, applied alternately to each amplifier, cause both amplifiers to successively interchange their operating states, thereby successively changing the state of the counter. The state of the counter at any time is indicated by the output voltage of either amplifier, since that voltage is at one level when the amplifier is conducting and at a second level when it is nonconducting. Assemblies of large numbers of binary counters, very often employing transistor amplifiers in order to achieve compactness and low power consumption, find wide application in digital computing and data processing equipment.

Since the trigger pulses to be counted are usually supplied from a single source, a pulse steering circuit is necessary for directing successive trigger pulses alternately to the two counter amplifiers. The construction of the steering circuit employed has an important effect on the permissible trigger pulse duration and repetition frequency. In some cases a relatively long delay is involved before a trigger pulse which is applied to the steering circuit actually reaches the proper counter amplifier, so that the counter may fail to properly respond to very short trigger pulses. On the other hand, if the steering circuit is designed to operate rapidly in response to short trigger pulses, a somewhat longer trigger pulse may cause both amplifiers to interchange their states twice. In that case the counter will have failed to count that pulse since it will be back in the same state as before the pulse occurred.

A further problem in attempting to operate a binary counter at high trigger pulse repetition frequencies is that a finite time is required for each of the counter amplifiers to change state. This causes serious deterioration of the waveshapes of the output voltages derived from the counter.

An object of the invention is to provide an improved high speed binary counter.

A further object is to provide a binary counter wherein correct trigger pulse steering is effected with minimum delay and is maintained unchanged for an appreciable interval after occurrence of each trigger pulse.

A further object is to provide a binary counter which produces sharply defined output voltage waveshapes at the highest trigger pulse repetition frequency at which the counter amplifiers are capable of operating.

In accordance with the invention, the output terminals of the pair of amplifiers of a conventional binary counter are respectively connected to the input terminals of a pair of switches. Each switch is adapted to close, thereby producing a switching voltage at its output terminal, when the amplifier to which it is connected is in a particular one of its two possible operating states. A pair of normally nonconducting voltage gates are provided for respectively transmitting the switching voltages produced by the two switches to the two amplifiers. However, neither gate can do so until application of a trigger pulse thereto. Accordingly, successive trigger pulses applied to both gates cause a switching voltage to be applied alternately to both amplifiers to cause them to successively interchange their operating states. The only delay which occurs between occurrence of each trigger pulse and application of a switching voltage to one of the amplifiers is the time required for one of the voltage gates to become conductive in response to the pulse. This permits extremely short trigger pulse durations. In addition, after a change of state of the counter is initiated, a change back to the original state cannot be initiated until after a total delay equal to the time required for both amplifiers to interchange operating states, plus the time for the formerly quiescent switch to become active, plus the time for the formerly nonconductive voltage gate to become conductive. Trigger pulses having a duration as long as that total delay can therefore be tolerated without causing false operation of the counter.

In accordance with a further feature of the invention, the cross-coupling impedances connecting the input and output terminals of the two counter amplifiers are designed to resonate with the impedances by which supply voltages are conveyed to each of those amplifiers at a frequency approximately one-half of the repetition frequency of the trigger pulses to be counted. The waveforms of the output voltage pulses which are produced at the output terminals of the amplifiers when they interchange their states are thereby materially improved at high trigger pulse repetition frequencies.

A more detailed description of the invention is presented in the following specification and accompanying drawings, in which.

Figures 1, 2, 3:
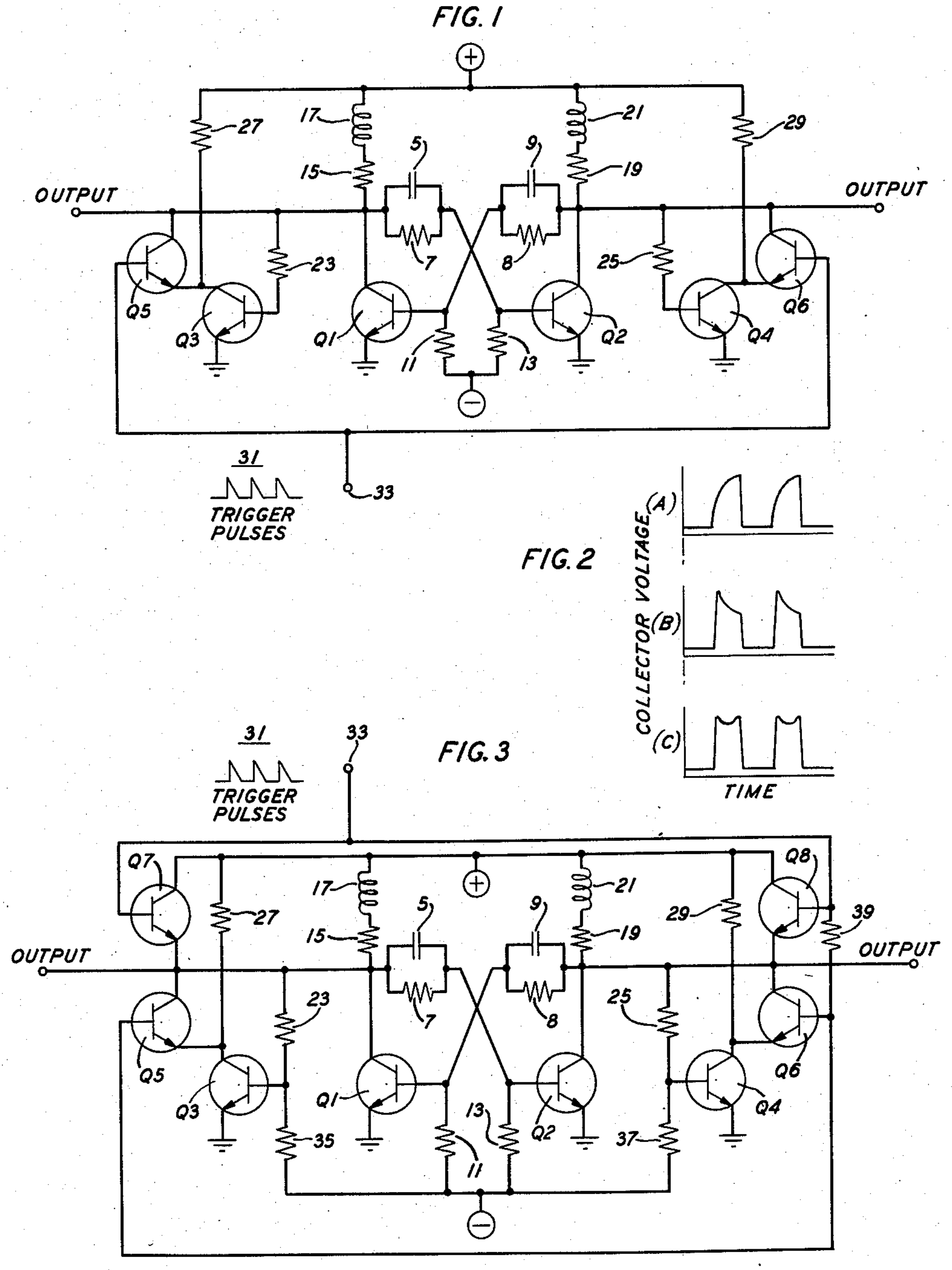
Fig. 1 is a circuit drawing of a binary counter constructed in accordance with the invention.
Fig. 2 is a group of waveforms showing how the output voltage of each amplifier in the counter of Fig. 1 is improved by the resonant characteristic of its output circuit.
Fig. 3 is a circuit diagram of a binary counter similar to that of Fig. 1, but with added means for still further increasing the speed of response of the counter.

The binary counter in Fig. 1 employs n-p-n junction transistors throughout. Of course, p-n-p junction transistors could be substituted so long as all voltage polarities in the circuit are reversed. Transistors Q1 and Q2 comprise the counter amplifiers, the collector of transistor Q1 being cross-coupled to the base of transistor Q2 by a capacitor 5 and resistor 7 in parallel, and the collector of transistor Q2 being cross-coupled to the base of transistor Q1 by a capacitor 9 and resistor 8 in parallel. The emitters of transistors Q1 and Q2 are grounded, and their bases are respectively connected by a pair of resistors 11 and 13 to a negative direct voltage supply with respect to ground. A resistor 15 and inductor 17 in series further connects the collector of transistor Q1 to a positive voltage supply with respect to ground, resistor 19 and inductor 21 in series serving the same purpose for the collector of transistor Q2. When either of transistors Q1 or Q2 is conducting, or "on," the resistance between its collector and emitter will be so small as to place its collector virtually at ground potential. Assuming that transistor Q1 is "on," the potential at the junction of resistors 7 and 13 will be negative. Since that junction is connected to the base of transistor Q2, the latter is held nonconducting, or "off." The potential at the collector of transistor Q2 is then sufficiently positive to render the voltage at the junction of resistors 8 and 11 positive. Since the base of transistor Q1 is connected to that junction, it is held "on." The counter is thus in one of its two stable states. If now a switching voltage pulse at ground potential is suddenly applied to the collector of transistor Q2, it will be conveyed through capacitor 9 to the base of transistor Q1 and will cause it to turn "off." The positive pulse then produced at the collector of transistor Q1 will be conveyed to the base of transistor Q2 by capacitor 5, causing it to turn "on." The counter will then be in its second stable state, and will remain so until another switching voltage pulse is applied to the collector of transistor Q1 to cause it and transistor Q2 to return to their initial states.

The speed with which the counter reverses its state in response to application of a switching voltage pulse to the collector of the one of transistors Q1 and Q2 which is "off" can be increased by maintaining the current at the collector of the "on" transistor substantially constant during the turn-off interval. That will assist the "on" transistor to turn "off," and will also hasten the charging of the cross-coupling capacitor connected to its collector. The inclusion of inductors 17 and 21 in the collector circuits of transistors Q1 and Q2, as described, serves this purpose. However, even with that advantage, it is found that at very high switching voltage repetition frequencies the turn-off edge of each output pulse produced at the collector of either of transistors Q1 and Q2 has the deteriorated form shown in waveform (A) of Fig. 2. Applicant has ascertained that the pulse waveform may be considerably improved and sharpened by choosing the sizes of cross-coupling capacitors 5 and 9, respectively, to resonate with inductors 17 and 21. Considering transistor Q1, if the resonant frequency of inductor 17 and capacitor 5 is too low, the output pulses produced at the collector of that transistor will be as shown by waveform B of Fig. 2. On the other hand, if the resonant frequency is too high, the collector voltage will resemble that of waveform (A) of Fig. 2. The desired very nearly flat-topped waveform (C) of Fig. 2 is obtained when capacitor 5 and inductor 17 are resonant at about one-half of the switching voltage repetition frequency. Of course, the same is true of capacitor 9 and inductor 21. In this way, good output voltage waveforms may be obtained at the highest possible repetition frequency at which transistors Q1 and Q2 are capable of operating.

Completing the circuit of Fig. 1, the collector of counter transistor Q1 is connected by a resistor 23 to the base of a third transistor Q3, and the collector of counter transistor Q2 is connected by a resistor 25 to the base of a fourth transistor Q4. The emitters of transistors Q3 and Q4 are grounded, and their collectors are respectively connected by resistors 27 and 29 to the positive voltage supply. The collectors are further respectively connected to the emitters of a pair of additional transistors Q5 and Q6 which have their collectors respectively connected to the collectors of transistors Q1 and Q2. The trigger voltage pulses 31 to be counted, which are each positive by an amount not exceeding the positive supply voltage, are applied to an input terminal 33 connected to the bases of transistors Q5 and Q6. Assuming the counter to be in the state wherein transistor Q1 is "on" and transistor Q2 is "off," the positive potential at the collector of transistor Q2 is applied by resistor 25 to the base of transistor Q4 to hold the latter "on." The potential at the collector of transistor Q4, and so also that at the emitter of transistor Q6, is then at ground. At the same time, the ground potential at the collector of transistor Q1 is applied by resistor 23 to the base of transistor Q3 to hold it "off." The potential at the collector of transistor Q3, and so also that at the emitter of transistor Q5, is then equal to the positive supply voltage. Under this operating condition, a positive trigger voltage pulse at terminal 33 will succeed in causing transistor Q6 to turn "on" but will not cause transistor Q5 to turn "on" because its emitter will still be more positive than its base. When transistor Q6 turns "on" the voltage at its collector drops to ground, dropping the potential at the collector of "off" counter transistor Q2 to ground. Since that constitutes a switching voltage pulse of the kind described above, the counter will switch to the state wherein transistor Q1 is "off" and transistor Q2 is "on." Transistor Q3 will thereby be turned "on" to produce a switching voltage at ground potential at its collector, while transistor Q4 will be turned "off." Transistor Q6 turns "off" when the trigger pulse at input terminal 33 terminates, so that the counter is then ready to respond to a subsequent trigger voltage pulse.

It is apparent from the foregoing description that transistors Q3 and Q4 serve as switches which are adapted to produce a switching voltage under the control of counter transistor amplifiers Q1 and Q2, and that transistors Q5 and Q6 serve as voltage gates which remain nonconducting until a trigger pulse causes the one which is connected to the active one of transistors Q3 and Q4 to conduct. A switching voltage is then transmitted to the collector of the one of counter transistor amplifiers Q1 and Q2 which is "off," causing both of them to interchange their operating states.

It should be noted that each trigger pulse will turn "on" only one of transistors Q5 and Q6 to cause application of a switching voltage to the collector of the one of transistors Q1 and Q2 which is "off." This is accomplished by this invention because only the proper one of transistors Q3 and Q4 will already be "on" before the trigger pulse occurs. Since the time required to turn "on" a single transistor, Q5 or Q6, is very short, the counter will respond almost instantaneously to even extremely short trigger pulses at input terminal 33.

With regard to the maximum permissible duration of each trigger pulse, assume that such a pulse occurs when transistor Q1 is "on" and transistor Q2 is "off." As described above, this will result in transistor Q6 turning "on" to cause transistor Q1 to turn "off" and transistor Q2 to turn "on." When transistor Q1 has turned "off" it will cause transistor Q3 to turn "on." If the trigger pulse is still present by the time this sequence is completed, it will tend to cause transistor Q5 to turn "on," and so to cause counter transistors Q1 and Q2 to return to their original states. This limits the permissible trigger pulse duration to the sum of the times for transistor Q1 to turn "off," transistor Q3 to turn "on," and transistor Q5 to turn "on." Inasmuch as this total is appreciable, an adequate margin exists for use of reasonably wide trigger pulses.

Referring now to the embodiment of the invention in Fig. 3, except for the mode of connection of input terminal 33 to the bases of transistors Q5 and Q6, the circuit therein incorporates all of the circuit of Fig. 1. It also includes a pair of switching means in the form of n-p-n junction transistors Q7 and Q8 respectively shunting the collector load impedances of transistors Q1 and Q2. This achieves a still further increase in the operating speed of the circuit in accordance with the teachings of applicant's co-pending application for a "Transistor Trigger Circuit," Serial No. 621,254, filed November 9, 1956, and assigned to applicant's assignee. A still further addition is the pair of resistors 35 and 37 respectively connecting the bases of transistors Q3 and Q4 to the negative supply voltage. This increases the speed with which the one of transistors Q3 and Q4 which is "on" turns "off" when the one of counter transistors Q1 and Q2 connected thereto turns "on."

The collectors of transistors Q7 and Q8 are connected to the positive voltage supply, and their bases are connected to trigger pulse input terminal 33. The bases of transistors Q7 and Q8 are further connected by a resistor 39 to the bases of transistors Q5 and Q6. The emitter of transistor Q7 is connected to the collector of counter transistor Q1, and the emitter of transistor Q8 is connected to the collector of counter transistor Q2. Assuming the counter to be in the state wherein transistor Q1 is "on" and transistor Q2 is "off," the potential at the emitter of transistor Q7 will be virtually at ground and the potential at the emitter of transistor Q8 will be positive. When one of trigger pulses 31 occurs at terminal 33, it is conveyed directly to the bases of transistors Q7 and Q8 and will succeed in turning transistor Q7 "on." Transistor Q8 remains "off" since the potential at its emitter will be more positive than at its base. The trigger pulse is also applied through resistor 39 to the bases of transistors Q5 and Q6, and, as described above, causes transistor Q6 to turn "on" and apply a switching voltage to the collector of counter transistor Q2. Transistor Q2 thereby turns "on" and counter transistor Q1 turns "off." The process whereby the states of transistors Q1 and Q2 are interchanged in this way is greatly speeded by virtue of transistor Q7 being "on," since its low emitter-to-collector resistance results in virtually the full positive supply voltage being directly applied to the collector of "on" transistor Q1. A very large surge of current is thus supplied to the collector of transistor Q1 to hasten it in turning "off," to the base of transistor Q2 to hasten it in turning "on," and to capacitor 5 to charge it more rapidly. Since transistors Q7 and Q8 must supply current to the collector of the one of transistors Q1 and Q2 which is "on," while transistors Q5 and Q6 supply current to the collector of the one of transistors Q1 and Q2 which is "off," more current must be supplied to the bases of transistors Q7 and Q8 than to the bases of transistors Q5 and Q6. Resistor 39 serves to assist in establishing this division of the current produced by each trigger pulse at terminal 33.

It should be noted that when transistor Q1 has turned "off" its collector voltage will rise sufficiently to cause transistor Q7 to revert to the "off" state. At the same time, since transistor Q2 will have turned "on," if the trigger pulse is still present it will tend to turn transistor Q8 "on." That, in turn, tends to turn transistor Q2 "off." However, because of the time delay until transistor Q4 turns "off," transistor Q6 will still be "on" to divert the emitter current of transistor Q8 away from the collector of transistor Q2, thus preventing it from turning "off." It should also be noted that since a finite time is required for either of transistors Q7 and Q8 to turn "off" after it is "on," the advantages provided by those transistors will be obtained even with very short trigger pulses.

It will be evident to those skilled in the pulse circuitry art that many modifications of the disclosed specific embodiments of applicant's invention may be made without departing from the scope and teachings thereof. As one example, emitter followers may be added in the cross-couplings between the collectors and bases of counter transistors Q1 and Q2. This will permit larger loads to be connected to the collectors than would otherwise be permissible without causing excessive output voltage amplitude degradation. In addition, while the illustrated circuits employ transistors, since transistors Q1 and Q2 operate as amplifiers and the remaining transistors operate at switches, known equivalent amplifying and switching elements may be substituted therefor.

What is claimed is:

1. A binary counter comprising a pair of amplifiers, a first pair of impedances respectively cross-connecting the input and output terminals of said amplifiers to form a regenerative feedback loop wherein both amplifiers assume mutually opposite operating states which they interchange when a switching voltage is applied to the output terminal of the amplifier in a selected one of those states, the voltages at the output terminals of said amplifiers respectively being at a first and second level, a second pair of impedances respectively connected to the output terminals of said amplifiers for conveying supply voltages thereto, each of said second pair of impedances being adapted to resonate at a predetermined frequency with the one of said first pair of impedances which is connected to the same amplifier output terminal, a pair of switching means respectively connected at their input terminals to the output terminals of said amplifiers, each of said switching means being adapted to produce said switching voltage at its output terminal when the output terminal of the amplifier to which its input terminal is connected is at said first level, a pair of normally closed gating means respectively connecting the output terminals of said pair of switching means to the output terminals of the same amplifiers to which their input terminals are connected, each of said gating means having a control terminal at which application of a trigger pulse causes it to open, and means for applying a series of trigger pulses at substantially twice said predetermined frequency to the control terminal of each of said gating means, whereby said switching voltage is applied to the output terminal of the one of said amplifiers in said selected operating state in response to each of said trigger pulses.

2. A binary counter comprising a pair of amplifiers, a first pair of impedances respectively cross-connecting the input and output terminals of said amplifiers to form a regenerative feedback loop wherein both amplifiers assume mutually opposite operating states which they interchange when a switching voltage is applied to the output terminal of the amplifier in a selected one of those states, a second pair of impedances respectively connected to the output terminals of said amplifiers for conveying supply voltages thereto, each of said second pair of impedances being adapted to resonate at a predetermined frequency with the one of said first pair of impedances which is connected to the same amplifier output terminal, a pair of pulse generating means respectively connected at their output terminals to the output terminals of said amplifiers, and means for applying a series of trigger pulses at substantially twice said predetermined frequency to the input terminal of each of said pulse generating means, the one of said pulse generating means which is connected to the amplifier in said selected state being adapted to produce a switching voltage pulse at its output terminal in response to each of said trigger pulses.

3. The binary counter of claim 2, wherein each of said first pair of impedances comprises a capacitive reactance and each of said second pair of impedances comprises an inductive reactance.

4. A binary counter comprising a pair of amplifiers, a pair of cross-coupling impedances respectively connecting the input and output terminals of said amplifiers to form a regenerative feedback loop wherein both amplifiers assume mutually opposite operating states which they interchange when a switching voltage is applied to the output terminal of the amplifier in a selected one of those states, the voltages at the output terminals of said amplifiers respectively being at a first and second level, a pair of switching means respectively having a control terminal and an output terminal, each of said switching means being adapted to produce said switching voltage at its output terminal when the voltage at its control terminal is at said first level, means respectively connecting the control terminals of said pair of switching means to the output terminals of said amplifiers, a pair of normally closed gating means respectively connecting the output terminals of said pair of switching means to the output terminals of the same amplifiers to which their control terminals are connected, each of said gating means having a control terminal at which application of a trigger pulse causes it to open and means for applying a series of trigger pulses to the control terminals of said pair of gating means, whereby each of said trigger pulses causes said switching voltage to be applied to the output terminal of the one of said amplifiers in said selected operating state.

5. The binary counter of claim 4, further including an additional pair of impedances respectively connected to the output terminals of said amplifiers for conveying supply voltages thereto, those of said cross-coupling and additional impedances which are connected to the same amplifier output terminal being resonant at substantially one-half the frequency of said series of trigger pulses.

6. A binary counter comprising a pair of amplifiers, a pair of cross-coupling impedances respectively connecting the input and output terminals of said amplifiers to form a regenerative feedback loop wherein both amplifiers assume mutually opposite first and second operating states wherein the voltages at their output terminals are respectively at a first and second level, both of said amplifiers being adapted to interchange their states when a switching voltage is applied to the output terminal of the amplifier in said first state, a first pair of switching means respectively having a control terminal and an output terminal, each of said first pair of switching means being adapted to produce said switching voltage at its output terminal when the voltage at its control terminal is at said first level, means respectively connecting the control terminals of said first pair of switching means to the output terminals of said amplifiers, a second pair of switching means respectively having a control terminal, an output terminal and an input terminal, each of said second pair of switching means being adapted to conduct the voltage at its input terminal to its output terminal when a trigger voltage is present at its control terminal, means respectively connecting the input terminals of said second pair of switching means to the output terminals of said first pair of switching means, further means respectively connecting the output terminals of said second pair of switching means to the output terminals of the same amplifiers to which their respective first switching means control terminals are connected, and means for applying a series of trigger pulses to the control terminals of said second pair of switching means, whereby each of said trigger pulses causes said switching voltage to be applied to the output terminal of the amplifier in said first operating state.

7. The binary counter of claim 6, further including an additional pair of impedances respectively connected to the output terminals of said amplifiers for conveying supply voltages thereto, those of said cross-coupling and additional impedances which are connected to the same amplifier output terminal being resonant at substantially one-half the frequency of said series of trigger pulses.

8. A binary counter comprising a pair of transistor amplifiers which each have an emitter, a collector and a base, a first pair of impedances respectively cross-connecting the collector of each of said amplifiers to the base of the opposite amplifier to render one amplifier nonconducting and the other amplifier conducting, said amplifiers being adapted to interchange their operating states when a switching voltage is applied to the collector of the one which is nonconducting, a second pair of impedances respectively connected to the collectors of said amplifiers for conveying supply voltages thereto, each of said second pair of impedances being adapted to resonate at a predetermined frequency with the impedance in said first pair which is connected to the collector of the same one of said amplifiers, a pair of switching means respectively connected at their input terminals to the collectors of said amplifiers, each of said switching means being adapted to produce said switching voltage at its output terminal when the amplifier to which it is connected is nonconducting, a pair of normally nonconducting gating means respectively connecting the output terminals of said pair of switching means to the collectors of the same amplifiers to which their input terminals are connected, each of said gating means having a control terminal at which application of a trigger pulse causes it to open, and means for applying a series of trigger pulses at substantially twice said predetermined frequency to the control terminal of each of said gating means, whereby each of said trigger pulses causes said switching voltage to be applied to the collector of the one of said transistors which is nonconducting.

9. A binary counter comprising a pair of transistor amplifiers which each have an emitter, a collector and a base, a pair of cross-coupling impedances respectively cross-connecting the collector of each of said amplifiers to the base of the opposite amplifier to render one amplifier nonconducting with its output voltage at a first level and the other amplifier conducting with its output voltage at a second level, said amplifiers being adapted to interchange their operating states when a switching voltage is applied to the collector of the one which is nonconducting, a pair of transistor switches respectively having a collector and a base, each of said switches being adapted to produce said switching voltage at its collector when the voltage at its base is at said first voltage level, means respectively connecting the bases of said pair of switches to the collectors of said pair of amplifiers, a pair of normally closed gating means respectively connecting the collectors of said pair of switches to the collectors of the same amplifiers to which their bases are connected, each of said pair of gating means having a control terminal at which application of a trigger pulse causes that gating means to open, and means for applying a series of trigger pulses to the control terminals of said pair of gating means, whereby each of said trigger pulses causes said switching voltage to be applied to the collector of the one of said amplifiers which is nonconducting.

10. The binary counter of claim 9, further including an additional pair of impedances respectively connected to the collectors of said amplifiers for conveying supply voltages thereto, those of said cross-coupling and additional impedances which are connected to the collector of the same one of said amplifiers being resonant at substantially one-half the frequency of said series of trigger pulses.

11. A binary counter comprising a pair of transistor amplifiers which each have an emitter, a collector and a base, a pair of cross-coupling impedances respectively connecting the collector of each of said amplifiers to the base of the opposite amplifier to render one of said amplifiers nonconducting with its output voltage at a first level and the other of said amplifiers conducting with its output voltage at a second level, said amplifiers being adapted to interchange their operating states when a switching voltage is applied to the collector of the one which is nonconducting, a pair of voltage switching means respectively connected at their input terminals to the collectors of said amplifiers, each of said switching means being adapted to produce said switching voltage at its output terminal when the voltage at the collector of the amplifier connected thereto is at said first level, a pair of transistor gates respectively having an emitter, a collector and a base, each of said gates being adapted to conduct the voltage at its emitter to its collector only when a trigger voltage is applied to its base, means respectively connecting the emitters of said pair of gates to the output terminals of said pair of switching means, means respectively connecting the collectors of said pair of gates to the same collectors of said amplifiers to which their respective switching means input terminals are connected, and means for applying a series of trigger pulses to the bases of said pair of gates, whereby each of said trigger pulses causes said switching voltage to be applied to the collector of the one of said amplifiers which is nonconducting.

12. The binary counter of claim 11, further including an additional pair of impedances respectively connected to the collectors of said amplifiers for conveying supply voltages thereto, those of said cross-coupling and additional impedances which are connected to the collector of the same one of said amplifiers being resonant at substantially one-half the frequency of said series of trigger pulses.

13. A binary counter comprising a pair of transistor amplifiers which each have an emitter, a collector and a base, a pair of cross-coupling impedances respectively connecting the collector of each of said transistors to the base of the opposite transistor to render one of said transistors nonconducting with its output voltage at a first level and the other of said transistors conducting with its output voltage at a second level, said transistors being adapted to interchange their operating states when a switching voltage is applied to the collector of the one which is nonconducting, a first pair of transistor switches respectively having a base and a collector, each of said first pair of switches being adapted to produce said switching voltage at its collector when the voltage at its base is at said first voltage level, means respectively connecting the bases of said first pair of switches to the collectors of said amplifiers, a second pair of transistor switches respectively having an emitter, a collector and a base, each of said second pair of switches being adapted to conduct the voltage at its emitter to its collector only when a trigger voltage is applied to its base, means respectively connecting the emitters of said second pair of switches to the collectors of said first pair of switches, further means respectively connecting the collectors of said second pair of switches to the same output terminals of said amplifiers to which their respective first switching means bases are connected, and means for applying a series of trigger pulses to the bases of said second pair of switches, whereby each of said trigger pulses causes said switching voltage to be applied to the collector of the one of said amplifiers which is nonconducting.

14. The binary counter of claim 13, further including an additional pair of impedances respectively connected to the collectors of said amplifiers for conveying supply voltages thereto, those of said cross-coupling and additional impedances which are connected to the collector of the same one of said amplifiers being resonant at substantially one-half the frequency of said series of trigger pulses.

15. A trigger pulse steering circuit for a binary counter of the type having a common terminal and two output terminals which may assume either of two levels of potential, said steering circuit comprising a first pair of transistors which each have a base, an emitter and a collector electrode, means for connecting the emitter-to-collector paths of said first pair of transistors in series between said common terminal and one of the output terminals of said counter, a second pair of transistors which each have a base, an emitter and a collector electrode, second means for similarly connecting the emitter-to-collector paths of said second pair of transistors between said common terminal and the other of the output terminals of said counter, impedance means for respectively connecting the base electrode of one of the transistors in each of said pairs to the counter output terminal which is associated with that pair, and means for applying a series of trigger pulses to the base electrode of the remaining transistor in each of said pairs.

References Cited in the file of this patent

UNITED STATES PATENTS

| | | |
|---|---|---|
| 2,557,644 | Forbes | June 19, 1951 |
| 2,719,228 | Auerbach et al. | Sept. 27, 1955 |
| 2,759,104 | Skellett | Aug. 14, 1956 |
| 2,816,237 | Hageman | Dec. 10, 1957 |